(12) United States Patent
Yu et al.

(10) Patent No.: US 9,305,769 B2
(45) Date of Patent: Apr. 5, 2016

(54) THIN WAFER HANDLING METHOD

(71) Applicant: TAIWAN SEMICONDUCTOR MANUFACTURING COMPANY, LTD., Hsinchu (TW)

(72) Inventors: Chen-Hua Yu, Hsinchu (TW); Wen-Chih Chiou, Zhunan Township (TW); Shin-Puu Jeng, Hsinchu (TW); Hung-Jung Tu, Hualien (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 32 days.

(21) Appl. No.: 14/157,210

(22) Filed: Jan. 16, 2014

(65) Prior Publication Data
US 2014/0130962 A1 May 15, 2014

Related U.S. Application Data

(63) Continuation-in-part of application No. 12/818,362, filed on Jun. 18, 2010, now Pat. No. 8,871,609.

(60) Provisional application No. 61/221,890, filed on Jun. 30, 2009.

(51) Int. Cl.
*H01L 21/30* (2006.01)
*H01L 21/02* (2006.01)
*H01L 21/18* (2006.01)
(Continued)

(52) U.S. Cl.
CPC ........ *H01L 21/02057* (2013.01); *H01L 21/187* (2013.01); *H01L 21/2007* (2013.01); *H01L 21/6835* (2013.01); *H01L 2221/68318* (2013.01); *H01L 2221/68327* (2013.01);
(Continued)

(58) Field of Classification Search
CPC ............ H01L 21/02057; H01L 21/187; H01L 21/6837; H01L 21/2007; H01L 21/7654; H01L 2221/68318; H01L 2221/68327; H01L 2221/68381; Y10T 156/10; Y10T 156/1158; Y10T 156/1153
USPC ................. 438/458–459, 514, 584, 689, 795; 257/E21.215, E21.294, E21.328, 257/E21.334
See application file for complete search history.

(56) References Cited

U.S. PATENT DOCUMENTS 5,391,917 A 2/1995 Gilmour et al.
5,510,298 A 4/1996 Redwine
(Continued)

FOREIGN PATENT DOCUMENTS

TW 200818255 6/1996
TW 529095 4/2003
(Continued)

OTHER PUBLICATIONS

Office Action dated Mar. 26, 2013 from corresponding application No. TW099121418.
(Continued)

*Primary Examiner* — Calvin Choi
(74) *Attorney, Agent, or Firm* — Hauptman Ham, LLP

(57) ABSTRACT

A method includes receiving a carrier with a release layer formed thereon. A first adhesive layer is formed on a wafer. A second adhesive layer is formed over the first adhesive layer or over the release layer. The carrier and the wafer are bonded with the release layer, the first adhesive layer, and the second adhesive layer in between the carrier and the wafer.

20 Claims, 4 Drawing Sheets

(51) Int. Cl.
*H01L 21/683* (2006.01)
*H01L 21/20* (2006.01)
*H01L 21/46* (2006.01)

(52) U.S. Cl.
CPC ..... *H01L 2221/68381* (2013.01); *Y10T 156/10* (2015.01); *Y10T 156/1153* (2015.01); *Y10T 156/1158* (2015.01)

(56) References Cited

U.S. PATENT DOCUMENTS

| | | | |
|---|---|---|---|
| 5,767,001 | A | 6/1998 | Bertagnolli et al. |
| 5,998,292 | A | 12/1999 | Black et al. |
| 6,184,060 | B1 | 2/2001 | Siniaguine |
| 6,206,441 | B1 | 3/2001 | Wen et al. |
| 6,214,733 | B1 | 4/2001 | Sickmiller |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |
| 6,543,988 | B2 | 4/2003 | Hsiao et al. |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,800,930 | B2 | 10/2004 | Jackson et al. |
| 6,841,883 | B1 | 1/2005 | Farnworth et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 | 2/2008 | Chanchani |
| 7,355,273 | B2 | 4/2008 | Jackson et al. |
| 7,462,551 | B2 | 12/2008 | Kulkarni et al. |
| 2003/0008437 | A1 | 1/2003 | Inoue et al. |
| 2006/0231527 | A1 | 10/2006 | Takayama et al. |
| 2008/0099149 | A1 | 5/2008 | Codding et al. |
| 2008/0182363 | A1 | 7/2008 | Amrine et al. |
| 2009/0039496 | A1 | 2/2009 | Beer et al. |
| 2009/0075217 | A1 | 3/2009 | Brodsky |
| 2009/0197390 | A1 | 8/2009 | Rothwell et al. |
| 2009/0218560 | A1 | 9/2009 | Flaim et al. |
| 2010/0148353 | A1 | 6/2010 | Kim et al. |
| 2010/0263794 | A1 | 10/2010 | George et al. |
| 2010/0330788 | A1 | 12/2010 | Yu et al. |

FOREIGN PATENT DOCUMENTS

| | | |
|---|---|---|
| TW | 544739 | 8/2003 |
| TW | 200842174 | 11/2008 |
| TW | 200842957 | 11/2008 |
| WO | 2004006296 | 1/2004 |

OTHER PUBLICATIONS

"3M Wafer Support System: For Ultra-Thin Wafer Backgrinding—down to Mircrons", 3M Industries Business, St. Paul, MN, 2004, 1-4.
Office Action dated Jul. 28, 2014 from corresponding No. TW 099121418.

THIN WAFER HANDLING METHOD

CROSS-REFERENCE TO RELATED APPLICATIONS

The present application is a continuation-in-part of U.S. patent application Ser. No. 12/818,362 filed on Jun. 18, 2010, which claims priority of U.S. Provisional Patent Application Ser. No. 61/221,890 filed on Jun. 30, 2009, both of which are entirely incorporated by reference herein.

TECHNICAL FIELD

This disclosure relates generally to wafer processing and more particularly to a thin wafer handling structure and method to facilitate bonding and debonding.

BACKGROUND

In semiconductor wafer processing, temporary bonding and debonding techniques are necessary for thin wafer backside processes. The wafer is bonded on a rigid carrier by adhesive layers. After grinding and/or other post-bonding processes, the wafer is debonded from the rigid carrier.

One of the conventional debonding methods uses a laser on a light-to-heat conversion layer (LTHC) to release the carrier, and then peel off the adhesive. The adhesive material is UV-cured material, e.g., thermal setting polymer, that cannot be stripped by chemicals and should be peeled off instead. This method suffers chemical residue after debonding. Also, the laser release layer has a weak chemical resistance during backside processes.

Another conventional method uses chemical release. This method chemically dissolves the adhesive to release the wafer from the carrier. This method needs perforated glass and easily induces cross contamination. The process speed, e.g., wafers per hour (WPH), is also slow compared to the other methods.

Yet another conventional method is thermal sliding. This method treats the wafer and carrier with heat and then slides them apart. This method needs higher debonding temperatures and may adversely impact the interconnection scheme.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the invention.

A thin wafer handling structure and method to facilitate bonding and debonding for wafer process are provided. Throughout the various views and illustrative embodiments of the present disclosure, like reference numbers are used to designate like elements.

Figure 1:
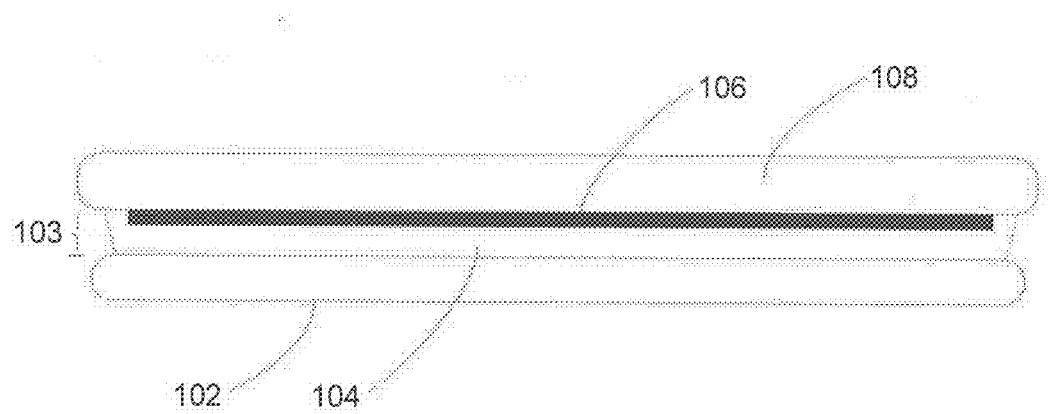
FIG. 1 illustrates an example of a thin wafer handling structure to facilitate bonding and debonding according to one aspect of the present disclosure.

FIG. 1 illustrates an example of a thin wafer handling structure to facilitate bonding and debonding according to one aspect of the present disclosure. The wafer 102 is bonded on the carrier 108 using two layers in between, i.e. the release layer 106 and the adhesive layer 104. The release layer 106 is applied on carrier 108 by coating or lamination processes followed by removal of the outer most 0.1 mm-3 mm of the release layer 106 from the edge of the carrier by edge bead removal (EBR). EBR removes a build-up of material at the wafer edges. Without any intervention, excess material may accumulate at the edge of the wafer at up to several times the nominal thickness of the layer. Such a condition would present a significant contamination risk for process equipment. For chemical EBR, solvent is dispensed on the edge of the wafer as the wafer is rotated immediately after coating.

The release layer 106 can comprise light-to-heat conversion (LTHC) layer such as epoxy or acryl-based polymer. The carrier 108 can be released by energy application on the release layer 106, e.g., ultraviolet (UV) or near infra-red (NIR) laser, or thermal treatment.

The adhesive layer 104 is applied on wafer 102 by coating or lamination process, and should be capable of being removed by solvent, e.g., thermal plastic polymer can be used as the adhesive layer 104 in one preferred embodiment. The carrier 108 and the wafer 102 are bonded together by UV light or thermal energy.

Thermal plastic polymer (also referred to as thermoplastic material) includes polypropylene (PP), polyethylene (PE), polyethylene terephthalate (PET), polyoxyethylene glycol (PEG), polyoxypropylene glycol (PPG), adipic ester (ADP), or any combination thereof, and other long-chain materials.

Figure 3:
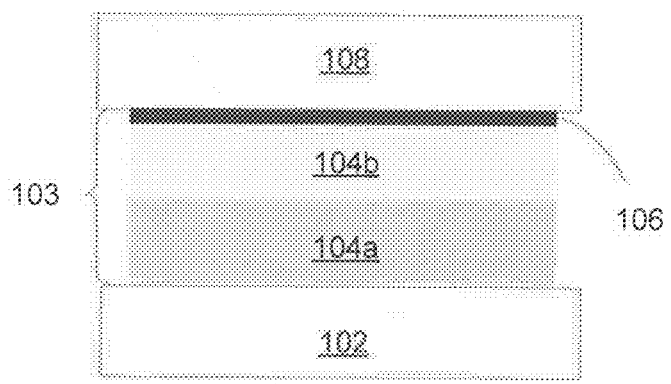
FIG. 3 illustrates another exemplary embodiment of the thin wafer handling structure according to one aspect of the present disclosure.

Even though an adhesive layer and release layer combination 103 in FIG. 1 shows one adhesive layer 104 with the release layer 106 to help temporary bonding of the wafer 102 and the carrier 108, the adhesive layer 104 can comprise multiple adhesive layers in some embodiments as shown in FIG. 3.

Figure 2:
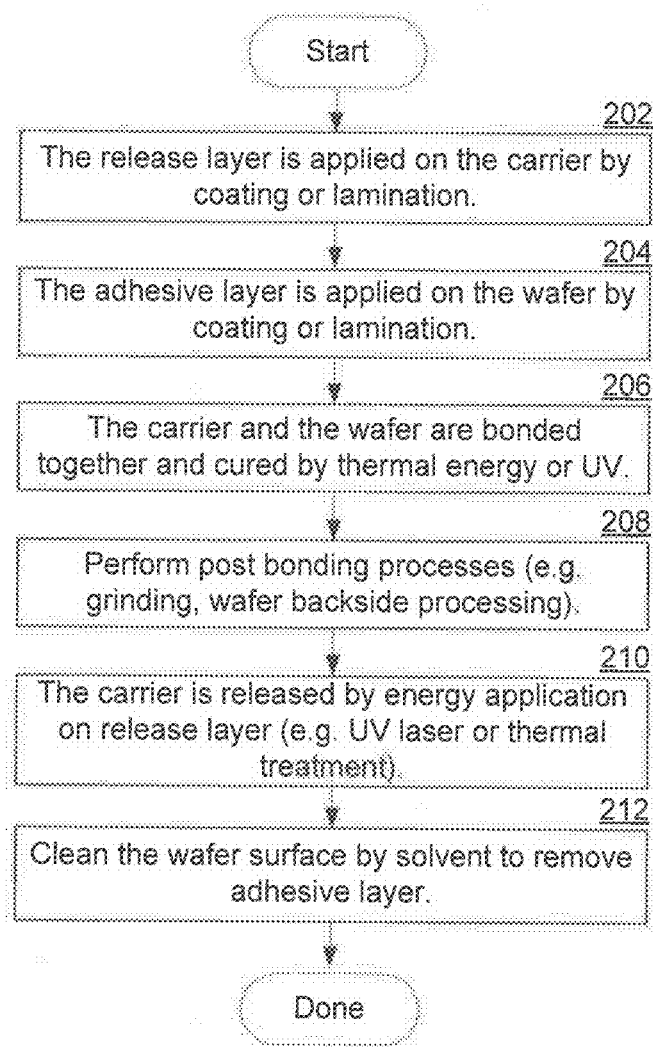
FIG. 2 illustrates an example method to facilitate thin wafer bonding and debonding according to another aspect of the present disclosure.

FIG. 2 illustrates an example method to facilitate thin wafer bonding and debonding according to another aspect of the present disclosure. At step 202, the release layer 106 is applied on the carrier 108 by coating or lamination. Spin coating can be used for release layer application according to one embodiment. At step 204, the adhesive layer 104 is applied on the wafer 102 by coating or lamination. At step 206, the carrier 108 and the wafer 102 are bonded together with the release layer 106 and the adhesive layer 104 in between and cured by thermal energy or UV light. The adhesive can be pre-baked prior to bonding. At step 208, the wafer goes through post-bonding processes, e.g., grinding, wafer backside processing, etc. The wafer backside processing may include ion implantation, annealing, etching, sputtering, evaporation, and/or metallization, etc.

After the post-bonding processes, the wafer goes through the debonding processes, which includes carrier release and post cleaning. At step 210, the carrier 108 is released by energy application on the release layer 106, e.g., UV or NIR light from a laser, or thermal treatment. The thin wafer 102 can be attached on dicing frame for dicing tape lamination prior to releasing the carrier. Then the wafer 102 surface is cleaned by chemical soaking in solvent to remove any residue of the adhesive layer 104. For example, an adhesive layer 104 using thermal plastic polymer can be chemically cleaned with a solvent. A skilled person in the art will appreciate that there can be many embodiment variations of this disclosure.

In some embodiments, an organic type solvent can be used as the solvent to clean and remove the adhesive layer 104. In other embodiments, different methods such as ashing or surface grinding process can be used to remove the adhesive layer 104. In one example, an ashing process using strongly oxidizing ambient, such as oxygen plasma ashing, can be used. In another example, any suitable surface grinding method including chemical mechanical polishing (CMP) can be used. Ashing can provide relatively uniform surface removal, and surface grinding can provide a cost-effective way of removal.

FIG. 3 illustrates another exemplary embodiment of the thin wafer handling structure according to one aspect of the present disclosure. There are two adhesive layers 104a and 104b shown in FIG. 3. The adhesive layer 104a adjacent to a wafer 102 comprises thermoplastic material or thermoset material and the adhesive layer 104b adjacent to the release layer 106 can comprise thermoset material or thermoplastic material in some embodiments.

Thermoset material for the adhesive layer 104b can be curable short-chain polymer materials, such as UV epoxy, Benzocyclobutene (BCB), Methylsilsesquioxane (MSQ), polyimides, and other short-chain polymers. Thermoplastic material for the adhesive layer 104a can comprise polypropylene (PP), polyethylene (PE), polyethylene terephthalate (PET), polyoxyethylene glycol (PEG), polyoxypropylene glycol (PPG), Adipic ester (ADP), any combination thereof, or other long-chain materials.

The thickness of the adhesive layers 104a and 104b can vary depending on the wafer size and the surface structure of the wafer 102. For example, with a wafer size of about 30 cm (or surface with up to 120 μm height variation), the total thickness of adhesive layers 104a and 104b can range from 10 μm to 250 μm, the thickness of the adhesive layer 104a can range from 0.5 μm to 50 μm, and the thickness of the adhesive layer 104b can range from 9.5 μm to 200 μm.

The multiple adhesive layers 104a and 104b helps to protect device surface of the wafer 102, and also provides better process compatibility such as better temperature/pressure property. For example, for metallization in a redistribution layer (RDL) process, a high temperature up to 350° C. or more can be reached. When the adhesive layer 104b comprises thermoset material with better high temperature property, and the adhesive layer 104a comprises thermoplastic material with better cleaning property, such adhesive layers 104a and 104b are suited for the RDL process, compared to one adhesive layer comprising thermoplastic material. Such adhesive layer structure using multiple adhesive layers reduces wafer cracks and residue after debonding, helps to maintain a robust line yield during post bonding processes, and saves the cost of bond/debond process for high volume production.

In some embodiments, different material combinations of the adhesive layers 104a and 104b can be selected based on temperature property, structure protection, and/or cleaning, among other properties. In some embodiments, the adhesive layer 104a can be selected based on the protection property of the wafer 102. For example, the adhesive layer 104a can comprise polyoxyethylene glycol (PEG), polyoxypropylene glycol (PPG), or adipic ester (ADP), and the adhesive layer 104b can comprise PE or PP for the adhesive property.

In some embodiments when thermoplastic materials are used for adhesive layers 104a and 104b, different materials such as PP, PE, PET, polyoxyethylene glycol (PEG), polyoxypropylene glycol (PPG), adipic ester (ADP), or any combination thereof, can be used for adhesive layers 104a and 104b. In some other embodiments, the same thermoplastic material can be used for both adhesive layers 104a and 104b. In some embodiments, more than two adhesive layers can be used, such as three, four, etc.

The release layer 106 can comprise a light-to-heat conversion (LTHC) layer such as epoxy or acryl-based polymer. The carrier 108 can be released by energy application on the release layer 106, e.g., UV or NIR laser, or thermal treatment.

Figure 4:
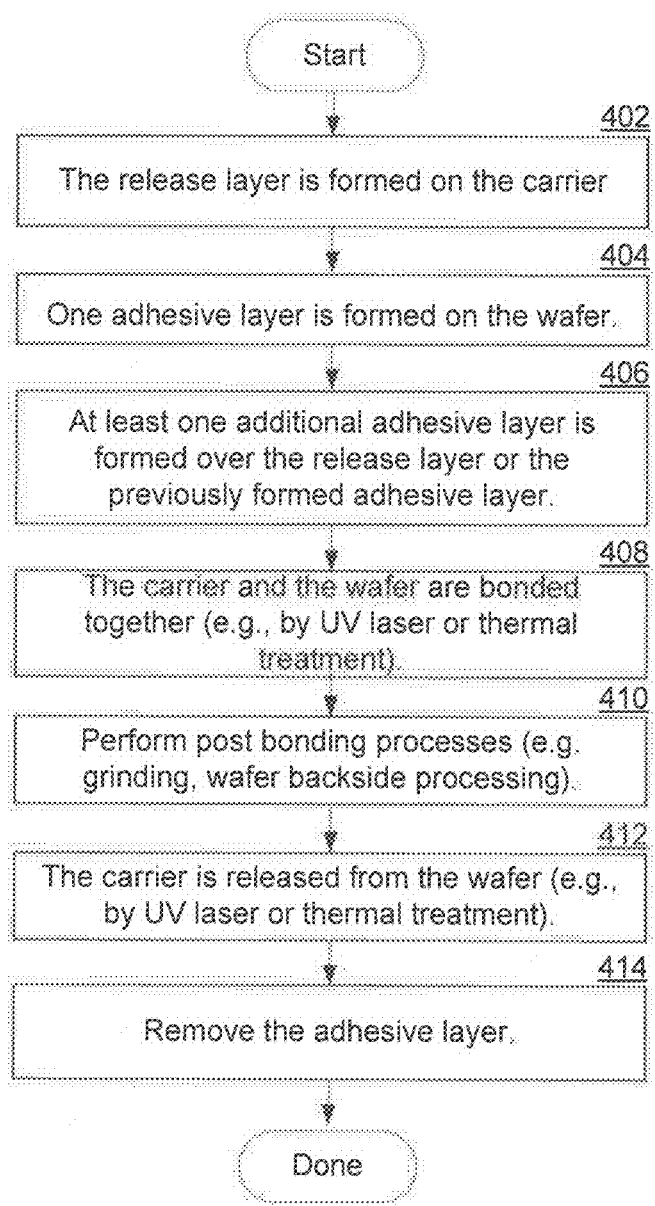
FIG. 4 illustrates another exemplary method to facilitate thin wafer bonding and debonding according to another aspect of the present disclosure.

FIG. 4 illustrates another exemplary method to facilitate thin wafer bonding and debonding according to another aspect of the present disclosure. At step 402, the release layer 106 is formed on the carrier 108 by coating or lamination, for example. At step 404, one adhesive layer such as 104a is formed on the wafer 102 by coating or lamination, for example. Spin coating can be used for release layer 106 and adhesive layer 104a according to some embodiments.

At step 406, at least one additional adhesive layer such as 104b is formed over the release layer 108 or the previously formed adhesive layer 104a by coating or lamination (before bonding the carrier 108 with the wafer 102). If the additional adhesive layer such as 104b is formed over the previously formed adhesive layer 104a, the adhesive layer 104a can be cured by thermal treatment prior to forming the additional adhesive layer 104b. For example, a thermal treatment with the temperature ranging from 150° C. to 350° C. can be used for less than 2 hours in some embodiments.

At step 408, the carrier 108 and the wafer 102 are bonded together with the release layer 106 and the adhesive layers 104a and 104b in between and cured by thermal energy or light from UV or NIR laser. For example, light from a UV laser with a wavelength in the range from 250 nm to 400 nm, or an NIR laser with a wavelength in the range from 1000 nm to 1300 nm can be used in some embodiments. For thermal energy, a temperature ranging from 150° C. to 350° C. can be used for less than 30 minutes in some embodiments. The adhesive layers 104a and 104b can be pre-baked prior to bonding in some embodiments.

At step 410, the wafer 102 goes through post-bonding processes, e.g., grinding, wafer backside processing, wafer metal routing (such as RDL), etc. The wafer backside processing may include ion implantation, annealing, etching, sputtering, evaporation, and/or metallization, among other processes.

After the post-bonding processes, the wafer goes through the debonding processes, which includes carrier release and post cleaning. At step 412, the carrier 108 is released by energy application on the release layer 106, e.g., UV or NIR laser, or thermal treatment. The thin wafer 102 can be attached on dicing frame for dicing tape lamination prior to releasing the carrier.

At step 414, the adhesive layers 104a and 104b are removed. Ashing, cleaning, surface grinding, or any combination thereof can be used to remove the adhesive layers 104a and 104b after debonding the wafer 102 from the carrier 108. Ashing can provide relatively uniform surface removal, and surface grinding can provide a cost-effective way of removal. For cleaning, the wafer 102 surface can be cleaned by chemical soaking in solvent such as organic type solvent to remove any residue of the adhesive layers 104a and 104b. In some embodiments, one step cleaning can be used to remove the adhesive layers 104a and 104b. In other embodiments, multiple steps can be used such as grinding and then cleaning, ashing and then cleaning, or two cleaning steps.

The wafer handling method using multiple adhesive layers as described above reduces wafer cracks and residue after debonding, helps to maintain a robust line yield during post bonding processes, and saves cost of bond/debond process for high volume production.

According to some embodiments, a method includes receiving a carrier with a release layer formed thereon. A first adhesive layer is formed on a wafer. A second adhesive layer is formed over the first adhesive layer or over the release layer. The carrier and the wafer are bonded with the release layer, the first adhesive layer, and the second adhesive layer in between the carrier and the wafer.

According to some embodiments, a method includes receiving a carrier bonded to a wafer. A release layer and two adhesive layers are formed between the carrier and the wafer. The carrier is released by applying ultraviolet (UV) light, near infrared (NIR) laser, or thermal energy.

According to some embodiments, a method includes forming a first adhesive layer comprising thermoplastic material on a wafer. A second adhesive layer comprising thermoset material is formed on the first adhesive layer. At least one of the first adhesive layer or the second adhesive layer is cured. The wafer is bonded to a carrier. The carrier is released by applying energy. The first adhesive layer and the second adhesive layer are removed by cleaning.

The advantageous features of the present disclosure include surface cleanness after debonding and good chemical resistance during post-bonding processes. Although the present disclosure and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

What is claimed is:

1. A method, comprising:
   forming a first adhesive layer on a wafer;
   forming a second adhesive layer over the first adhesive layer or over a release layer on a carrier; and
   bonding the carrier and the wafer with the release layer, the first adhesive layer, and the second adhesive layer in between the carrier and the wafer, wherein the bonding process is subsequent to forming the first adhesive layer on the wafer, and a peripheral portion of the wafer is free of the release layer.

2. The method of claim 1, wherein at least one of the first adhesive layer or the second adhesive layer comprises a thermoplastic material.

3. The method of claim 2, wherein the thermoplastic material comprises at least one of polypropylene (PP), polyethylene (PE), polyethylene terephthalate (PET), polyoxyethylene glycol (PEG), polyoxypropylene glycol (PPG), or adipic ester (ADP).

4. The method of claim 1, wherein at least one of the first adhesive layer or the second adhesive layer comprises a thermoset material.

5. The method of claim 4, wherein the thermoset material comprises at least one of UV epoxy, Benzocyclobutene (BCB), Methylsilsesquioxane (MSQ), or polyimides.

6. The method of claim 1, further comprising curing at least one of the first adhesive layer or the second adhesive layer prior to bonding the carrier and the wafer.

7. The method of claim 1, wherein the carrier and the wafer are bonded together by applying at least one of ultraviolet (UV) light, a near infrared (NIR) laser, or thermal energy.

8. The method of claim 1, further comprising releasing the carrier by applying at least one of ultraviolet (UV) light, a near infrared (NIR) laser, or thermal energy.

9. The method of claim 8, further comprising removing the first adhesive layer and the second adhesive layer.

10. The method of claim 9, wherein the removing the first adhesive layer and the second adhesive layer is performed by at least one of ashing, cleaning, or grinding.

11. The method of claim 9, wherein the removing the first adhesive layer and the second adhesive layer is performed by cleaning and the cleaning is performed using an organic type solvent.

12. The method of claim 9, further comprising performing a post-bonding process on the wafer.

13. The method of claim 12, wherein the post-bonding process includes grinding or wafer backside processing.

14. The method of claim 9, wherein the first adhesive layer comprises a thermoplastic material, the second adhesive layer comprises a thermoset material, and the removing the first adhesive layer and the second adhesive layer is performed by cleaning using an organic solvent.

15. The method of claim 9, wherein the first adhesive layer comprises a thermoset material, the second adhesive layer comprises a thermoset material, and the removing the first adhesive layer and the second adhesive layer is performed by grinding.

16. A method, comprising:
    receiving a carrier bonded to a wafer, wherein a release layer and two adhesive layers are between the carrier and the wafer, the release layer is in direct contact with the two adhesive layers, a first layer of the two adhesive layers are in direct contact with the wafer, and the two adhesive layers are in direct contact with each other, and a peripheral portion of the wafer is free of the release layer; and
    releasing the carrier by applying ultraviolet (UV) light, a near infrared (NIR) laser, or thermal energy.

17. The method of claim 16, wherein at least one of the two adhesive layers comprises at least one of a thermoplastic material or a thermoset material.

18. The method of claim 16, further comprising removing the two adhesive layers by at least one of ashing, cleaning, or grinding.

19. A method, comprising:
    forming a first adhesive layer comprising a thermoplastic material on a wafer;
    forming a second adhesive layer comprising a thermoset material on the first adhesive layer;
    curing at least one of the first adhesive layer or the second adhesive layer after forming the first adhesive layer on the wafer;
    bonding the wafer to a carrier, wherein a periphery of the wafer is free of a release layer;

releasing the carrier by applying energy; and removing the first adhesive layer and the second adhesive layer by cleaning.

20. The method of claim 19, further comprising performing a grinding process on the wafer after bonding the wafer to the carrier and before releasing the carrier.

\* \* \* \* \*